United States Patent [19]

Froncisz et al.

[11] 4,453,147

[45] Jun. 5, 1984

[54] MODULAR LUMPED CIRCUIT RESONATOR

[75] Inventors: Wojciech Froncisz, Cracow, Poland; James S. Hyde, Dousman, Wis.

[73] Assignee: Medical College of Wisconsin, Inc., Milwaukee, Wis.

[21] Appl. No.: 361,594

[22] Filed: Mar. 25, 1982

[51] Int. Cl.³ .................... H01P 7/00; G01N 27/00
[52] U.S. Cl. .................................. 333/219; 333/235; 324/316; 324/321
[58] Field of Search .................... 333/202, 219–235, 333/206–209; 324/300–325, 71.1

[56] References Cited

U.S. PATENT DOCUMENTS

| | | | |
|---|---|---|---|
| 3,358,222 | 12/1967 | Hyde | 324/300 |
| 3,402,346 | 9/1968 | Baker | 324/322 |
| 3,559,043 | 1/1971 | Hyde | 324/316 |
| 4,240,033 | 12/1980 | Anderson et al. | 324/321 |
| 4,314,204 | 2/1982 | Biehl | 324/316 |

OTHER PUBLICATIONS

Meyer–"Helical Resonators for Measuring Dielectric Properties of Materials", IEEE Trans. on Microwave Theory and Techniques, vol. MTT-29, No. 3, Mar 1981, pp. 240–247.

W. N. Hardy and L. A. Whitehead; "Split–ring Resonator for Use in Magnetic Resonance from 200-2000 MHz" published in Rev. Sci. Instrum., vol. 52, No. 2, Feb. 1981.

Primary Examiner—Marvin L. Nussbaum
Attorney, Agent, or Firm—Barry E. Sammons

[57] ABSTRACT

A structure for supporting a loop-gap resonator includes a cylindrical housing which defines a space into which microwave energy is injected. The resonator is mounted to a support element which is inserted into the space through an opening at one end of the housing. The support element and attached resonator form an interchangeable module.

13 Claims, 5 Drawing Figures

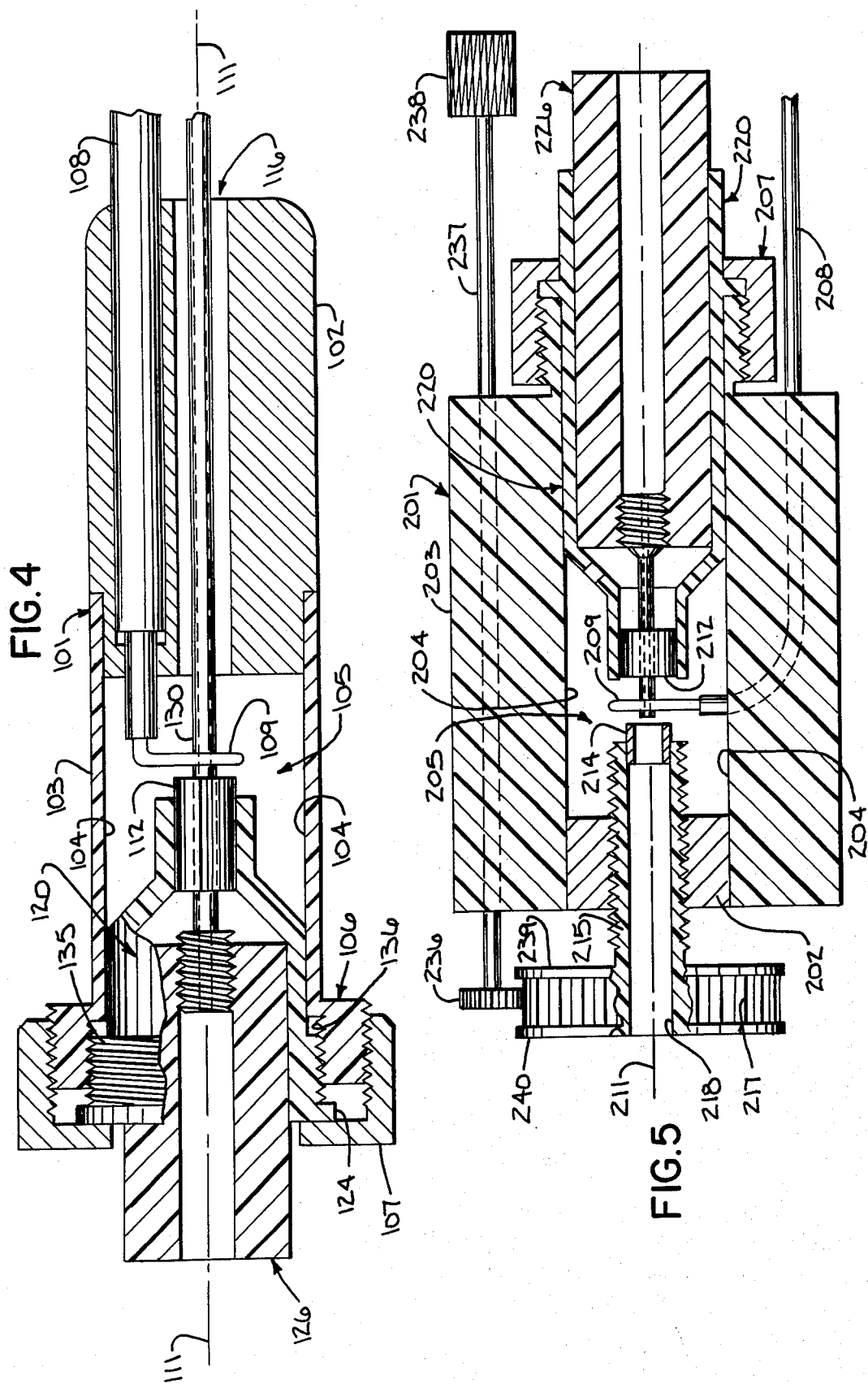

MODULAR LUMPED CIRCUIT RESONATOR

GOVERNMENT RIGHTS

The invention described herein was made in the course of work under a grant or award from the Dept. of Health and Human Services. This invention was also made with Government support under PCM-78-23206 awarded by the National Science Foundation. The Government has certain rights in this invention.

BACKGROUND OF THE INVENTION

The field of the invention is radio frequency resonators, and particularly, resonators employed in gyromagnetic resonance spectroscopy.

Gyromagnetic resonance spectroscopy is conducted to study nuclei that have a magnetic moment, which is called nuclear magnetic resonance (NMR) and electrons which are in a paramagnetic state which is called paramagnetic resonance (EPR) or electron spin resonance (ESR). There are also a number of other forms of gyromagnetic spectroscopy that are practiced less frequently, but are also included in the field of this invention. In gyromagnetic resonance spectroscopy a sample to be investigated is subjected to a polarizing magnetic field and one or more radio frequency magnetic fields. The frequency, strength, direction, and modulation of the magnetic fields varies considerably depending upon the phenomena being studied. Apparatus such as that disclosed in U.S. Pat. Nos. 3,358,222 and 3,559,043 has been employed for performing such experiments in laboratories, but widespread commercial use of gyromagnetic resonance spectroscopy techniques has been limited.

The reason for the limited commercial application of gyromagnetic resonance spectrometers is their complexity and high cost. Very high radio frequencies are required for some measurement techniques (such as electron spin resonance measurements) and very strong polarizing magnetic fields are required for others (such as nuclear magnetic resonance). In addition, the physical structures for applying multiple fields to a specimen are complex, particularly when the temperature of the specimen is to be controlled, or the specimen is to be irradiated with light during the measurement.

A loop-gap resonator which offers many advantages over prior structures used in gyromagnetic resonance spectrometers is disclosed in our co-pending U.S. Pat. application Ser. No. 310,231 which was filed on Oct. 9, 1981, and which is entitled "Microwave Resonator". The size of this loop-gap resonator, the number and size of the gaps which it contains and the materials from which it is constructed are variables which enable the resonator to be used in a large variety of measurements and over a wide range of frequencies.

SUMMARY OF THE INVENTION

The present invention relates to a supporting structure for a loop-gap resonator, which structure enables resonators of various sizes and shapes to be easily interchanged. More specifically the invention includes a cylindrical housing which defines a space which is disposed along a central axis and is open at one end, means for injecting electromagnetic energy into the space, and a resonator module which includes a loop-gap resonator attached to a resonator support, the resonator module being inserted into the space through the open end in the housing and the resonator support being secured to the housing such that the loop-gap resonator is supported inside the space along the central axis.

A general object of the invention is to provide a resonator structure which will accommodate a variety of loop-gap resonators. It has been discovered that the same supporting structure can be used with loop-gap resonators which resonate over a wide frequency range. Thus, by providing a separate resonator support for each loop-gap resonator, the resonator may be constructed as an interchangeable module.

Another object of the invention is to reduce the cost of gyromagnetic resonance spectrometers. By providing a large variety of interchangeable resonator modules which may be used in the same housing, a large variety of measurements may be performed with minimal duplication of hardware.

Another object of the invention is to provide a structure which facilitates the analysis of a wide variety of specimens. Specimens to be analyzed may require resonators of different physical dimensions in order to achieve the best possible performance. Thus, even though the resonant frequency may remain fixed during measurements on a series of specimens, it may be desirable to employ resonators of different sizes.

Yet another object of the invention is to provide a supporting structure which enables the position of the resonator to be adjusted and which enables the coupling of the electromagnetic energy to the resonator to be adjusted. The cylindrical shape of the housing lends itself to a number of mechanical arrangements which allow the rotational orientation of the resonator with respect to a polarizing magnetic field to be precisely controlled.

A more specific object of the invention is to provide a supporting structure which enables specimens to be easily inserted and positioned within the resonator and which enables such specimens to be subjected to a variety of experimental conditions. As described in our co-pending U.S. patent application Ser. No. 310,231 entitled "Microwave Resonator", the loop-gap resonator may take a number of forms which enable multiple magnetic fields to be applied to the specimen. Such variations include multiple gaps in the resonator in addition to variations in size and shape.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 4 is an elevation view with parts cut away of a second preferred embodiment of the invention; and FIG. 5 is an elevation view with parts cut away of a third preferred embodiment of the invention.

DESCRIPTION OF THE PREFERRED EMBODIMENT

Figure 1:
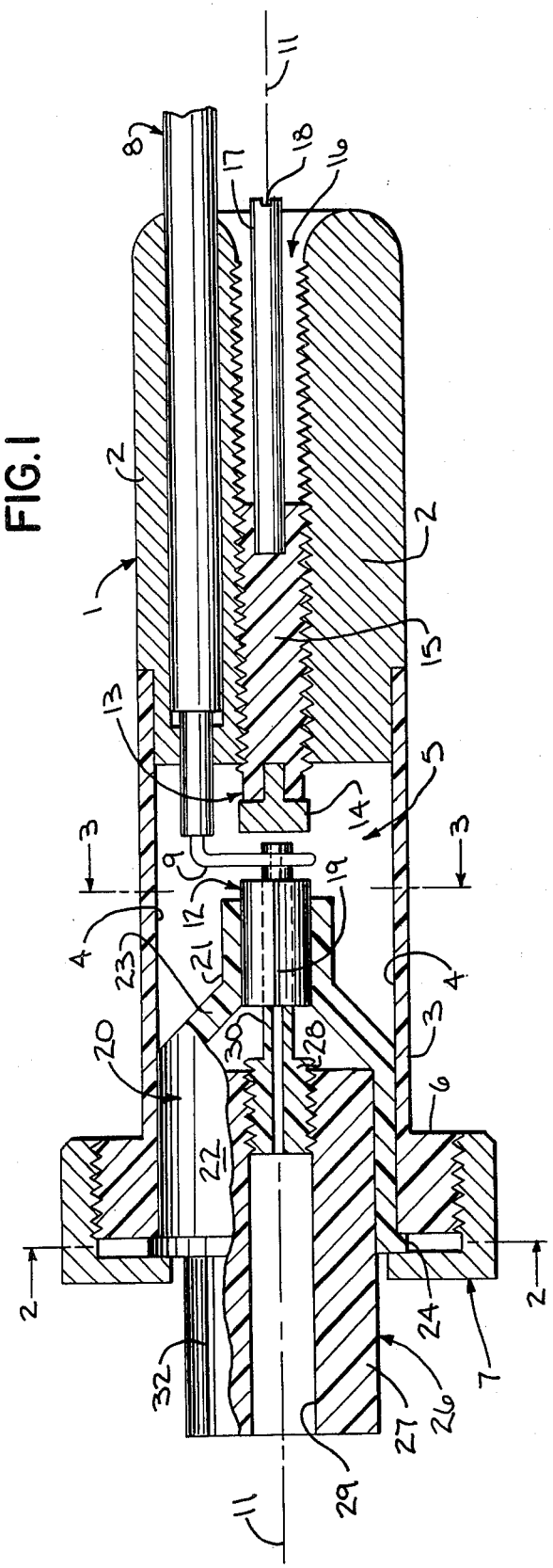
FIG. 1 is an elevation view with parts cut away of a first preferred embodiment of the invention.
Figure 3:
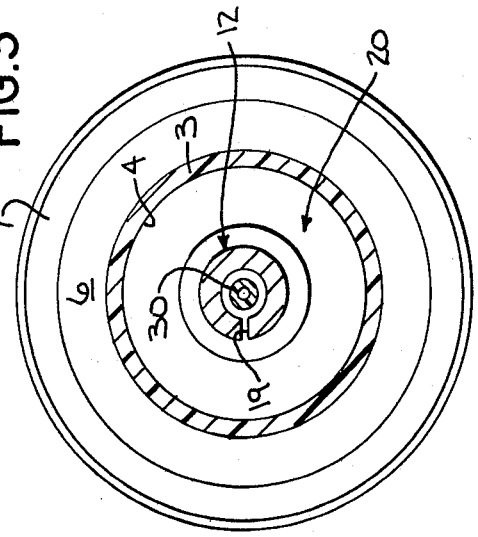
FIG. 3 is a view in cross section taken along the plane 3—3 indicated in FIG. 1.
Figure 2:
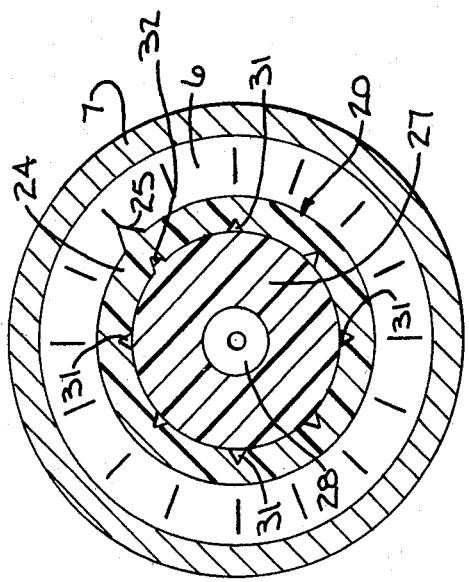
FIG. 2 is a view in cross section taken along the plane 2—2 indicated in FIG. 1.

Referring to FIGS. 1–3, the resonator construction includes a housing 1 which is circular, cylindrical in shape and which includes a brass support portion 2 and a sleeve portion 3. The sleeve 3 is formed from an electrically insulating material, such as a glass epoxy, and its inside surface is coated with a layer of silver to form a circular cylindrical shield 4. The shield 4 defines a space 5 which is substantially enclosed at one end by the brass support portion 2 and which has a circular opening at its other end. A collar 6 is formed on the end of the sleeve 3 around this opening and the outer surface of the collar 6 is threaded to receive an aluminum nut 7.

Electromagnetic energy is introduced into the space 5 through a coaxial cable 8. The cable 8 extends through an opening formed in the brass support 2 and its central conductor 9 is formed into a coupling loop which is positioned substantially concentric about a central axis 11 that extends through the space 5. A loop-gap resonator 12 is positioned on one side of this loop 9 and a mechanism 13 for adjusting the coupling is positioned on the other side. The coupling mechanism 13 includes a slug 14 formed from silver coated brass and a screw 15 which is formed from nylon. The screw 15 resides in a threaded opening 16 which extends through the brass support 2 along the central axis 11, and a shaft 17 connects to the screw 15 and extends out the opening 16.

The coupling of electromagnetic energy to the loop-gap resonator 12 may be adjusted by rotating the screw 15. A slot 18 is provided in the end of the shaft 17 to allow precise adjustment of this coupling. The slug 14 is a shorted turn to the magnetic field produced by the current in the coupling loop 9. The eddy currents induced in the slug 14 give rise to a magnetic field that opposes the magnetic field produced by the coupling loop 9, thereby decreasing the magnetic flux linkage between the coupling loop 9 and the resonator 12. The slug 14 should be a figure of revolution and may, for example, take the form of a ring or a disc. The slug 14 thus controls the coupling of electromagnetic energy to the resonator 12 from the loop 9.

The loop-gap resonator 12 may take any of the forms disclosed in the above-cited co-pending patent application which is incorporated herein by reference. The resonator's axial length, inside diameter, outside diameter and the number of longitudinal gaps 19 may be varied to provide the desired frequency, quality factor (Q) and filling factor. It is a major objective of the present invention to accommodate in a single structure as wide a variation as possible in such resonator variables.

This is accomplished in part by a resonator support element 20 which is formed from an electrically insulating material. A number of materials having low dielectric loss and good dimensional stability are suitable for this purpose, but a polystyrene material such as that sold under the trademark "Rexolite" and originally introduced to the trade by American Enka Corporation is preferred. The resonator support element 20 includes a circular cylindrical retainer portion 21 which encircles the resonator 12 and retains it in position along the central axis 11 by frictional engagement. The dimensions of this portion of the resonator support element 20 are determined by the outside diameter of the resonator 12. The resonator support element 20 also includes an alignment portion 22 which is circular cylindrical in shape and which slidably engages the inside surface of the sleeve 3. The retainer portion 21 and the alignment portion 22 are connected by an integral conical portion 23. A flange 24 is formed on the end of the guide portion 22, and when the flange 24 engages the end of the sleeve 3, the resonator support 20 is fully inserted. The nut 7 traps the flange 24 and securely fastens the support 20 in its operating position.

As shown best in FIG. 2, the flange 24 includes an integrally molded pointer 25 which extends radially outward from the flange 24. By removing the nut 7, this pointer 25 is exposed and the resonator support 20 may be rotated about the central axis 11 to a desired orientation. Marks are formed in the face of the collar 6 to provide an indication of the relative orientation of the support 20 and an attached resonator 12. These marks are calibrated in degrees and this feature enables the structure to be employed as a goniometer.

As explained in the above cited co-pending patent application, the loop-gap resonator 12 is particularly suited for use in electron spin resonance spectroscopy in which a sample material is inserted into the resonator 12 along its central axis 11. A sample holder 26 is employed for this purpose and it includes a sleeve portion 27 which slides into an alignment opening in the resonator support 20. The sample holder 26 also includes a container 28 which is screwed into a threaded opening 29 formed through the sleeve portion 27. The sample material (not shown in the drawings) is contained in a tube 30 which extends from the container 28, along the central axis 11, and through the resonator 12 and loop 9. The components of the sample holder 26 are made from polystyrene sold under the trademark "Rexolite", although other materials which exhibit a low dielectric loss and do not contain paramagnetic contaminants may be employed.

As shown in FIG. 2, the inside surface of the resonator support 20 has a series of longitudinal grooves 31 which are spaced equally about its circumference. A spline 32 is formed on the outer surface of the sample holder 26 and this spline 32 is received in one of the grooves 31 to fix the relative orientation of the sample holder 26 and resonator support 20. The orientation of the resonator support 20 may thus be precisely adjusted with respect to the housing 1, and the orientation of the sample holder 26 may be separately adjusted to accommodate a number of measurements in which such positioning is important.

It should be apparent that the above-described structure will accommodate a large range of loop-gap resonators 12. The only element which need be altered is the resonator support 20. More specifically, the diameter of the retainer portion 21 may be altered to accommodate resonators of different diameters and its length may be altered to accommodate resonators of different lengths. The conical portion 23 may also be affected by such variations, but the guide portion 22 remains unchanged so that the module, comprised of the resonator support element 20 and resonator 12 will fit properly in the housing 1.

Although the resonator 12 is preferably a separate element from the resonator support 20, it is also possible to form the resonator as an integral part of the support 20. In such case, the resonator 12 is formed as a metallic coating on a properly shaped base, as disclosed in our co-pending patent application Ser. No. 361,595 which was filed on even date herewith and is entitled "Microwave Resonator Structure". The base in such case is integrally formed on the end of the resonator support 20 and the resulting resonator 12 is an integral part of its support 20.

There are a number of variations possible in the structure to facilitate the carrying out of specific measurements. Referring to FIG. 4 for example, the brass support portion 102 of the housing 101 has been changed by removing the coupling slug. This alteration provides an unobstructed opening 116 which extends along the central axis 111 to the space 105 and to the interior of the resonator 112. This enables the sample contained inside the resonator 112 to be irradiated with light, or as shown in the drawing, it enables the tube 130 to be extended so that a continuous flow of sample material may be maintained through the resonator 112.

To allow adjustment of the coupling between the resonator 112 and the loop 109, a threaded bushing 135 is formed on the resonator support 120 beneath its flange 124. A corresponding threaded opening 136 is formed on the inner surface of the collar 106, and the axial position of the resonator support 120 can be accurately determined by rotating it about the central axis 111. When the desired coupling of electromagnetic energy to the resonator 112 is thus achieved, the aluminum nut 107 is tightened on the flange 124 to secure the resonator support 120 in place.

It should be apparent that numerous variations are possible in this adjustment mechanism. For example, the flange 124 may be a separate element which is in threaded engagement with the bushing 135. By adjusting the location of the flange 124 on the bushing 135, the axial position of the resonator support 120 may be adjusted without rotating the resonator 112. This variation may be desirable in some measurements.

Another embodiment of the invention is shown in FIG. 5. The housing 201 in this embodiment is constructed entirely of a glass epoxy and a shield 204 is formed on its inside surface to define a circular cylindrical space 205 which extends through its entire length. One end of the space 205 is enclosed by a brass plug 202 and its other end presents a circular opening through which a resonator support 220 is inserted. In this embodiment the coaxial cable 208 enters the space 205 radially inward through the shield 204 rather than axially through one of the ends.

The brass plug 202 contains a threaded opening which receives a threaded nylon screw 215. The nylon screw 215 supports at its one end a slug 214 which is formed from a silver coated brass ring, and it supports at its other end an integrally molded drive gear 217. The entire structure is aligned coaxially about the resonator's central axis 211, and an opening 218 extends through the entire structure along the central axis 211.

As in the first preferred embodiment of FIG. 1, the axial position of the conductive slug 214 may be axially positioned to adjust the coupling of electromagnetic energy from a loop 209 to a resonator 212. This axial positioning is accomplished by rotating the nylon screw 215 with a pinion gear 236 that engages the drive gear 217. The pinion gear 236 is formed on the end of a brass rod 237 which extends back through an opening formed in the housing 201. A knurled knob 238 is formed on the end of the rod 237 to facilitate manual adjustment. The rod 237 has complete freedom of movement and the pinion gear 236 is maintained in its engagement with the drive gear 217 by a pair of flanges 239 and 240 formed to each side of the drive gear 217.

It should be apparent that the embodiment of FIG. 5 offers a number of advantages. First, the axial opening 218 allows direct access to the space 205 and the sample which is positioned inside the resonator 212. Second, the coupling adjustment provided by the shaft 237 is conveniently positioned adjacent the opening in which the sample holder 226 is inserted. As a result, both the replacement of samples and the adjustment of the electromagnetic energy strength may be made from a single location. This is particularly convenient when the resonator structure is surrounded by large magnets or coils which apply bias or modulating fields to the structure.

We claim:

1. A resonator structure which comprises:
   a housing which defines a cylindrical space which is disposed along a central axis, which is bounded by a conductive shield, and which has an opening at one of its ends;
   means mounted to the housing for injecting electromagnetic energy into the space;
   a resonator module which includes a loop-gap resonator fastened to a resonator support, the resonator module being disposed in said opening at said one end of said housing with its resonator support engaging the housing to position the loop-gap resonator inside the cylindrical space along the central axis; and
   means for fastening the resonator support to the housing to retain the loop-gap resonator in position along said central axis.

2. The resonator structure as recited in claim 1 in which an alignment opening is formed through the resonator support along the central axis, and a sample holder is inserted into this alignment opening and projects into the loop-gap resonator.

3. The resonator structure as recited in claim 1 which includes means for adjusting the axial position of the resonator support to thereby adjust the axial position of the loop-gap resonator within the cylindrical space.

4. The resonator structure as recited in claim 1 in which the means for injecting electromagnetic energy into the space includes a loop which is mounted substantially coaxially with the central axis and adjacent to the loop-gap resonator, and an adjusting mechanism is mounted to the housing and includes a conductive slug which is positioned along the central axis to adjust the electromagnetic coupling between the loop and the loop-gap resonator.

5. The resonator structure as recited in claim 4 in which the loop-gap resonator has an opening aligned along the central axis, and the coupling mechanism is mounted to an enclosed end of the housing, coaxial with the central axis, and in which a central opening is formed through the coupling mechanism to enable direct access with the opening in the loop-gap resonator.

6. The resonator structure as recited in claim 1 in which the means for injecting electromagnetic energy into the space includes adjusting means for controlling the coupling of the injected energy to the resonator.

7. A resonator structure which comprises: a housing which defines a cylindrical space that is concentric about a central axis, and in which the housing includes a collar which encircles an opening at one end of the cylindrical space;
   a resonator module including:
   (a) an alignment portion which engages the housing and positions the resonator support within the cylindrical space and concentric with the central axis;

(b) a flange formed on one end of the alignment portion for engaging the collar of the resonator support;

(c) a cylindrical shaped loop-gap resonator having a central opening for receiving a sample to be measured;

(d) a retainer portion formed on the other end of the alignment portion for engaging and supporting the loop-gap resonator in the cylindrical cavity with the loop-gap resonator's central opening disposed along the central axis; and means mounted to the housing for injecting electromagnetic energy into the loop-gap resonator.

8. The resonator structure as recited in claim 7 in which an alignment opening is formed through the resonator support along the central axis, and a sample holder is inserted into this alignment opening and projects along the central axis to hold a sample in the loop-gap resonator's central opening.

9. The resonator structure as recited in claim 7 which includes means coupled to the collar for adjusting the axial position of the resonator module in the cylindrical space and for securely fastening the resonator module in place.

10. The resonator structure as recited in claim 7 in which the means for injecting electromagnetic energy into the cavity includes a loop which is mounted substantially coaxially with the central axis and is positioned adjacent to the loop-gap resonator, and an adjustment mechanism is mounted to the housing and includes a conductive slug which is positioned along the central axis to adjust the electromagnetic coupling between the loop-gap loop and the resonator.

11. The resonator structure as recited in claim 7 in which the resonator module may be rotated about the central axis and indicia means are provided on the collar for indicating the rotational orientation of the resonator module and the attached loop-gap resonator.

12. A resonator module for insertion into a housing, the combination comprising:

a loop-gap resonator having an opening which extends along a central axis;

a resonator support connected to the loop-gap resonator by a retainer which extends around the loop-gap resonator, the resonator support having an alignment opening which extends through the resonator support along the central axis and aligns with the opening in the loop-gap resonator, the resonator support also having a guide portion which engages the housing and positions the loop-gap resonator in the housing; and a sample holder which is received in the alignment opening of the resonator support and which extends along the central axis to support a sample material in the opening formed in the loop-gap resonator.

13. The resonator module as recited in claim 12 in which the loop-gap resonator, resonator support and sample holder are concentric with the central axis.

* * * * *